(12) United States Patent
Clochard et al.

(10) Patent No.: US 11,260,751 B2
(45) Date of Patent: Mar. 1, 2022

(54) OPTICAL-EFFECT TOUCHPAD ON A STEERING WHEEL FOR FINGER DETECTION

(71) Applicants: CONTINENTAL AUTOMOTIVE FRANCE, Toulouse (FR); CONTINENTAL AUTOMOTIVE GMBH, Hanovre (DE)

(72) Inventors: Pascal Clochard, Chevreuse (FR); Jerome Wroblewski, Thil (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 209 days.

(21) Appl. No.: 16/638,814

(22) PCT Filed: Sep. 4, 2018

(86) PCT No.: PCT/FR2018/052156
§ 371 (c)(1),
(2) Date: Feb. 13, 2020

(87) PCT Pub. No.: WO2019/048771
PCT Pub. Date: Mar. 14, 2019

(65) Prior Publication Data
US 2020/0189391 A1 Jun. 18, 2020

(30) Foreign Application Priority Data
Sep. 5, 2017 (FR) ...................................... 1758165

(51) Int. Cl.
*B60K 35/00* (2006.01)
*B60K 37/06* (2006.01)
(Continued)

(52) U.S. Cl.
CPC .............. *B60K 35/00* (2013.01); *B60K 37/06* (2013.01); *B62D 1/046* (2013.01);
(Continued)

(58) Field of Classification Search
CPC .. B60K 37/06; B60K 35/00; B60K 2370/782; B60K 2370/1446; B60K 2370/143;
(Continued)

(56) References Cited

U.S. PATENT DOCUMENTS 10,482,730 B2 * 11/2019 Takeda ..................... G06F 3/016
10,928,935 B2 * 2/2021 Clochard ............... B62D 1/046
(Continued)

FOREIGN PATENT DOCUMENTS

DE 102015200907 7/2016
FR 3023513 1/2016
(Continued)

OTHER PUBLICATIONS

International Search Report—PCT/FR2018/052156—dated Dec. 13, 2018.

*Primary Examiner* — Christopher E Leiby
(74) *Attorney, Agent, or Firm* — Nixon & Vanderhye

(57) ABSTRACT

Disclosed is a system for detecting command gestures made by a finger of a driver of a motor vehicle, including an interface pad, a light source that emits an optical beam in the infrared band toward the interface pad, an imaging sensor, for capturing images steered by the interface pad away from the driver, with a base frame and a movable plate, an optical zone of interest seen by the imaging sensor being defined at the interface between the base frame and the movable plate, the interface pad including an elastic deformable seal interposed between the base frame and the movable plate, the deformable seal including a first inclined facet, so that an optical path passing via the first inclined facet is propor-
(Continued)

tionally modified by the deformation of the seal under the effect of the movement of the movable pad.

20 Claims, 5 Drawing Sheets

(51) Int. Cl.
*B62D 1/04* (2006.01)
*G06F 3/0354* (2013.01)
*G06F 3/042* (2006.01)
*G06K 9/00* (2022.01)
*G06K 9/20* (2006.01)
*H03K 17/94* (2006.01)
*H03K 17/96* (2006.01)

(52) U.S. Cl.
CPC .......... *G06F 3/03547* (2013.01); *G06F 3/042* (2013.01); *G06K 9/00832* (2013.01); *G06K 9/2018* (2013.01); *H03K 17/941* (2013.01); *H03K 17/9627* (2013.01); *B60K 2370/128* (2019.05); *B60K 2370/133* (2019.05); *B60K 2370/143* (2019.05); *B60K 2370/146* (2019.05); *B60K 2370/1446* (2019.05); *B60K 2370/1464* (2019.05); *B60K 2370/1468* (2019.05); *B60K 2370/21* (2019.05); *B60K 2370/23* (2019.05); *B60K 2370/345* (2019.05); *B60K 2370/782* (2019.05); *H03K 2217/94108* (2013.01)

(58) Field of Classification Search
CPC ...... B60K 2370/1464; B60K 2370/128; B60K 2370/146; B60K 2370/1468; B60K 2370/21; B60K 2370/23; B60K 2370/345; B60K 2370/133; B62D 1/046; G06F 3/03547; G06F 3/042; G06K 9/00832; G06K 9/2018; H03K 17/941; H03K 17/9627; H03K 2217/94108
See application file for complete search history.

(56) References Cited

U.S. PATENT DOCUMENTS

| | | | |
|---|---|---|---|
| 11,110,799 B2 * | 9/2021 | Clochard | B60K 37/06 |
| 2005/0098417 A1 * | 5/2005 | Miyako | B60K 37/06 200/61.54 |
| 2015/0291032 A1 * | 10/2015 | Kim | G06F 3/0488 701/36 |
| 2018/0292949 A1 * | 10/2018 | Champinot | H03K 17/9627 |
| 2018/0308325 A1 * | 10/2018 | Takeda | G08B 6/00 |
| 2020/0254880 A1 * | 8/2020 | Clochard | B60K 37/06 |
| 2020/0348757 A1 * | 11/2020 | Forest | G06F 1/1626 |
| 2020/0348771 A1 * | 11/2020 | Clochard | G06F 3/03547 |

FOREIGN PATENT DOCUMENTS

| | | | |
|---|---|---|---|
| FR | 3028222 | 5/2016 | |
| JP | 2005-008125 | 1/2005 | |
| WO | WO2016/150572 | 9/2016 | |
| WO | WO-2016150572 A1 * | 9/2016 | B62D 1/046 |

* cited by examiner

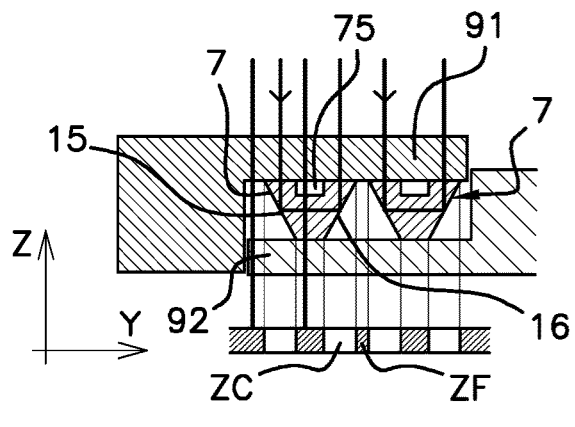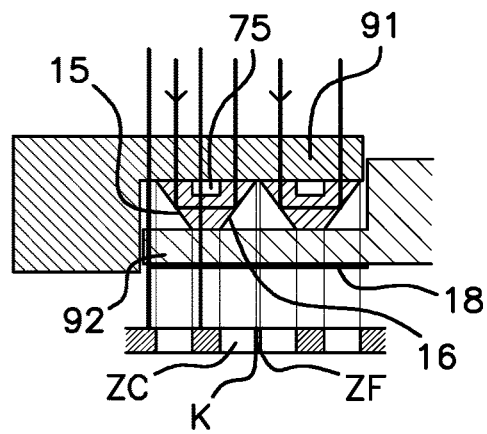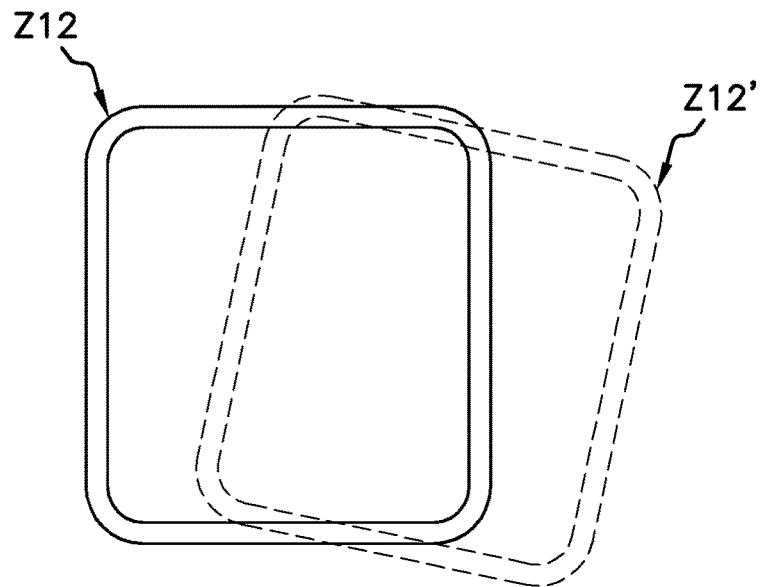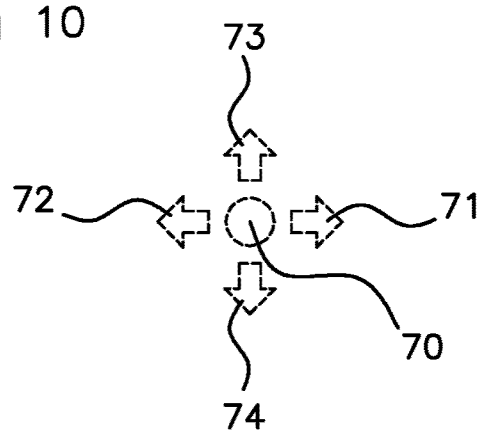

OPTICAL-EFFECT TOUCHPAD ON A STEERING WHEEL FOR FINGER DETECTION

BACKGROUND OF THE INVENTION

Field of the Invention

The present invention relates to the touchpads used on a steering wheel of a motor vehicle. More particularly, it relates to optical-effect touchpads for detecting finger gestures and/or touches by means of a standard camera, or more generally an imaging sensor.

Description of the Related Art

It is already well known to place control buttons in the spokes of the steering wheel that connect the central portion to the rim of the steering wheel, for example in order to control communication and/or audio functions or even the speed limiting/regulating function.

However, in the context of increasingly elaborate human-machine interfaces, this solution lacks flexibility because the buttons are dedicated. In addition, this requires a cabled electrical connection between the steering wheel in the rest of the vehicle.

Specifically, it is preferable to use solutions that do not require the presence of electronics inside the steering wheel and that do not require a cabled electrical connection between the steering wheel (which rotates) and the dashboard.

Moreover, it is highly recommendable for reasons of road safety to permanently keep the hands on the steering wheel or in immediate proximity to the latter, this providing motivation to place, on the steering wheel, human-machine interfaces that are accessible to the fingers of the driver when his hands are holding the rim, this objective however not always being compatible with the aforementioned constraints.

It has already been proposed to detect, by means of the type of camera referred to as a 3D camera, certain gestures made by the fingers of the driver when the fingers of the hand of the driver are located on a specific transparent pad in the vicinity of the steering wheel, as for example described in document FR 3 028 222. However, according to the proposed solution, it is necessary to make use of a specific camera (referred to as an "3D" camera) capable of measuring the distance with respect to each of the points of the objects seen in the field of view: this type of equipment is expensive. Moreover, it is very difficult to obtain a sufficient precision to determine whether the finger is touching the pad or whether the finger is not touching the pad, which difference is however very important from the point of view of the meaning of the gestures made by the fingers of the driver.

Therefore, the inventors have identified a need to provide other ways of achieving an interface for detecting command gestures on a touchpad in a steering wheel, without electronics in the steering wheel and without a cabled electrical connection between the steering wheel and the dashboard.

SUMMARY OF THE INVENTION

To this end, a system is proposed for detecting command gestures made by at least one finger of a driver of a motor vehicle, the system comprising:

at least one interface pad located in proximity to the rim of the steering wheel,
at least one light source that emits an optical beam mainly in the near-infrared band toward the interface pad,
an imaging sensor, for capturing at least images steered by the interface pad away from the driver,
wherein the interface pad comprises a base frame and a movable plate that is movable between a rest position and one or more activation positions obtained by pressing one of the fingers on the movable plate, the base frame and the movable plate lying generally in a reference plane XY and having a small thickness in the direction Z perpendicular to said reference plane XY, an optical zone of interest seen from the imaging sensor being defined at the interface between the base frame and the movable plate.

The detecting system is noteworthy in that the interface pad comprises an elastic deformable seal interposed between the base frame and the movable plate, the elastic deformable seal comprising at least one first inclined facet, so that an optical path passing via the first inclined facet is proportionally modified by the deformation of the elastic deformable seal under the effect of the movement of the movable plate and the modification of the optical path is detectable by the imaging sensor (especially in its geometry) in the optical zone of interest seen by the imaging sensor.

By virtue of such a system, it is possible to detect the strength of the force exerted on the movable plate, and not only an all-or-nothing action. The imaging sensor thus captures a zone of almost constant brightness the geometry of which is however dependent on the deformation of the seal and therefore on the force exerted on the movable plate.

The zone of almost constant brightness may take the form of a continuous peripheral strip or the form of a plurality of separate zones.

Certain finger movements, such as a pseudo click or a pseudo double-click, may thus be detected very reliably, with a reliability higher than that of prior-art image-processing operations that analyze how blurry the finger appears through the interface pad.

The proportionality to the deformation also allows a soft press to be distinguished from a harder press.

Advantageously, the driver keeps his hands on or in immediate proximity to the steering wheel, and may make, on the interface pad, control gestures while keeping good control of the steering wheel.

The imaging sensor is for example a video camera; generally, it is possible to speak of an optical sensor. The camera may be a conventional video camera or a 3D video camera as will be described in detail below.

The detected finger is a thumb, an index finger, a middle finger or another finger.

In various embodiments of the invention, one or more of the following arrangements may also be used.

According to one option, the first inclined facet is located facing a second inclined facet, which is separated from the first inclined facet by a wedge-shaped interval the geometry of which is gradually modified depending on a force exerted on the mobile plate.

Thus, from its point of view, the camera (the imaging sensor) perceives a modification in the geometry of the brightest zone, this brightest zone being easily identifiable.

According to one advantageous feature, the wedge-shaped interval closes when a finger presses on the movable plate in the direction of the imaging sensor.

This corresponds to the case where the movable plate is pressed with the thumb. The width of the luminous strip decreases proportionally to the applied force. According to one optional additional feature, the wedge-shaped interval opens when a finger presses on the movable plate in the direction of the driver.

This corresponds to the case where the movable plate is pulled by the index or middle finger in the direction of the driver. The width of the luminous strip decreases proportionally to the applied force.

According to one possibility, the segment of the optical beam that returns to the imaging sensor comprises a diffraction from the first inclined facet, a reflection from a reflective strip and a new diffraction on the first inclined facet, then a return to the camera (imaging sensor).

Advantageously, a clear and easily detectable luminous echo that is easily detectable by the camera is thus created. By "reflective strip", what is also meant is a strip that scatters or that has a catadioptric function. A "finger press" causes the seal to be squashed, and therefore a geometric decrease in the width of the bright (at the frequencies used) zone seen by the camera.

According to one complementary alternative optical design, the segment of the optical beam that does not return to the imaging sensor (camera) passes through the first and second inclined facets substantially in a straight line. In this location, the first and second inclined facets make contact with each other and therefore this portion of the optical beam is not returned to the imaging sensor; in addition, the emitted optical power is sufficiently low to not be hazardous to the eyes of the driver or of another occupant of the vehicle. A "finger pull" causes a traction of the seal, and therefore a geometric increase in the width of the bright (at the frequencies used) zone seen by the imaging sensor (camera).

According to another option, provision may be made for an optically absorbent strip to absorb the beam that passes through the inclined facets in a straight line.

According to another possible option, the deformable seal has a trapezoidal general cross section with a first inclined facet and a second inclined facet that is inclined opposite the first, the segment of the optical beam that returns to the imaging sensor comprising a diffraction from the first inclined facet and a diffraction on the second inclined facet.

The second inclined facet is the symmetric of the first with respect to the perpendicular direction Z and the two diffractions cause the incident beam to be returned to the imaging sensor; in contrast, the base of the trapezoid is passed through by the incident beam in a straight line, without return.

By virtue of these arrangements, bright zones and dim zones are created as seen by the imaging sensor. The bright zones and the dim zones are separated by a limit, and this limit moves proportionally to the force exerted on the movable plate.

According to one option, the elastic deformable seal has a trapezoidal cross section suitable for being squashed under pressure and the base of the deformable seal widens under a compressive stress. Such a seal is simple to manufacture in an extrusion die.

According to one option, the deformable seal has a hollow core. This allows the seal to be deformed and squashed more easily.

According to one option, the base frame forms a peripheral zone around said movable plate. The movable plate is thus protected by the frame and does not risk being damaged; provision may also be made for a delineation by a pattern visible to the driver, who intuitively expects to find the activation zone in the central zone of the interface pad.

According to one option, the one or more inclined facets may extend right around the perimeter of the movable plate, the seal being interposed in the reference plane XY between the base frame and the movable plate. In other words, the inclined facet extends all the way around the base frame. Image processing in the imaging sensor easily allows such a connected geometry to be identified and the position and orientation thereof to be determined.

According to another option, the one or more inclined facets may extend over only one portion of the perimeter. It is possible for example to have the inclined facet only on three sides, and more generally the optical zone of interest may be not be a connected space.

According to one option, the light source and the video imaging sensor are arranged in proximity to each other; thus a biasing effect and a possible parallax effect are avoided.

According to one option, the light source and the video imaging sensor are arranged in the vicinity of or in an instrument panel of the vehicle; the integration is thus facilitated.

According to one option, the video camera (imaging sensor) in question is also used for the drowsiness detection function; this makes it possible to use a single camera for the interface pad function and the "drowsiness detection" function.

According to one option, the video camera is conventional, i.e. without three-dimensional function; thus, a moderate cost, a choice of a high number of variants and a very small bulk are achieved.

According to one option, provision may be made for a push-button effect. This reinforces intuitiveness and gives a feeling of quality to the useful travel, which is small in the present case.

According to one option, the movable plate is transparent at least to infrared light, so that the imaging sensor is able to detect movements of a finger inside the zone covered by the movable plate through the movable plate.

According to one option, the light source emits in the 850-940 nm near-infrared band, and does not emit in the visible band. Thus, no discomfort is experienced by the driver or the other occupants of the vehicle, who see no spot of light in the instrument panel. Moreover, the emitted power in any case remains below the thresholds of ocular discomfort and/or hazard.

According to one option, provision is made for an elastic return to the rest position, said return preferably being achieved via the intrinsic resilience of the elastic deformable seal.

According to one option, the inclined facets are inclined at substantially 45° to the reference plane XY. Thus, a simple and reliable optical and geometric configuration is obtained.

According to one option, the elastic deformable seal is an extruded silicone seal.

BRIEF DESCRIPTION OF THE DRAWINGS

Other features and advantages of the invention will become apparent from the following description, which is given by way of nonlimiting example with reference to the appended drawings, in which:

FIG. 9 shows an example of an optical zone of interest seen by the imaging sensor, FIG. 10 shows the considered main typical movements of the thumb of the driver.

DESCRIPTION OF THE PREFERRED EMBODIMENTS

In the various figures, the same references have been used to reference identical or similar elements. For the sake of clarity of the description, some elements are not shown to scale.

Figure 1:
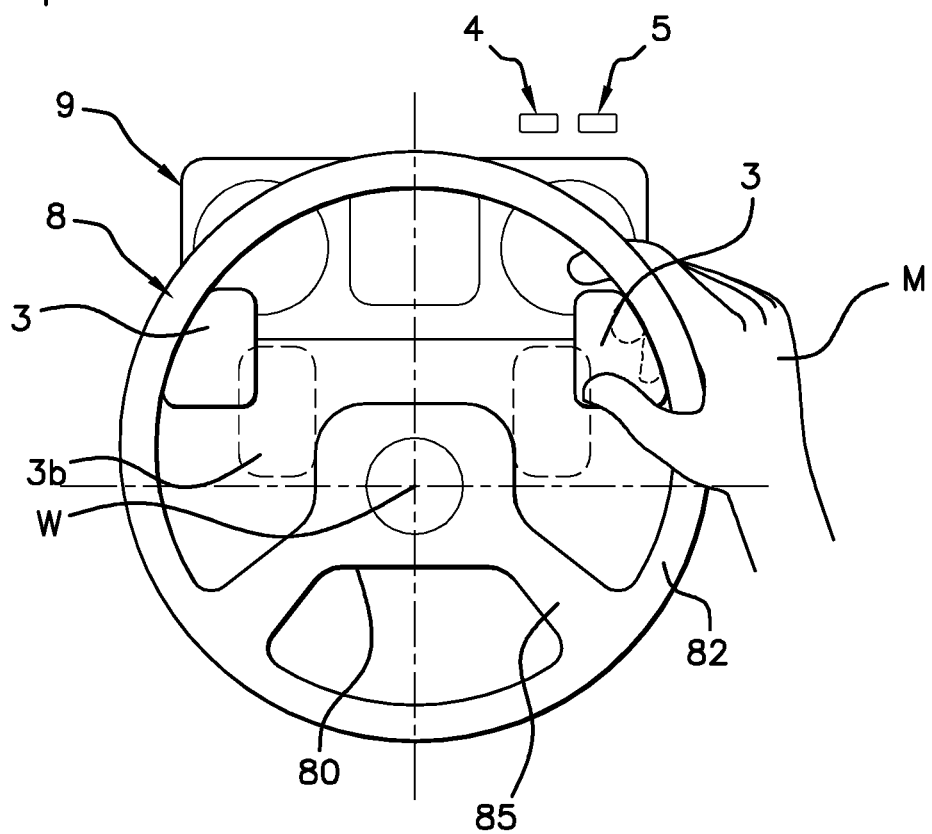
FIGS. 1 and 2 schematically show, face-on and in profile, respectively, a detecting system according to the present invention.

FIG. 1 shows a system for detecting command gestures made by a thumb P of a driver of a motor vehicle on an element that generally belongs to the steering wheel and that is referred to below as an interface pad 3 (described in detail below).

Below, the thumb of the hand M is denoted P, and all of the fingers (index finger, middle finger, ring finger, little finger) are each denoted F.

The illustrated steering wheel 8 is of the type comprising two spokes 85 but, of course, the number of spokes has no bearing on the present invention, it may be 3, 4 or even 1 (case of a single-spoke steering wheel).

The steering wheel 8 rotates about an axis denoted W and comprises a hub and a rim 82 as known per se. The rim may be shifted off-center with respect to the axis W, upward in straight-line configuration as illustrated in FIG. 1.

It is not excluded for the hub to comprise a central block 80 equipped with an airbag system; however, in one preferred variant, the airbags are located elsewhere in other portions of the cockpit and the steering wheel 8 is devoid of any electrical/electronic systems.

Behind the steering wheel 8 is positioned an instrument panel 9 as known per se. In this instrument panel 9, for example, provision is made for a light source 5 that mainly emits in the near-infrared domain, and an imaging sensor 5. This imaging sensor 5 is also referred to as a photographic sensor.

The images are captured by this imaging sensor 5 at a rate of a plurality of images per second, for example between 5 images per second and 25 images per second. This imaging sensor 5 may be a video camera, for example one based on a (color or monochromic) CCD sensor as known per se.

Preferably, the camera is of a conventional two-dimensional type unable to measure depth. In other words, it is not question of a "3D" camera, this type of camera also sometimes being referred to as a "time-of-flight" camera.

However, the use of such a "3D" camera is not excluded in the context of the proposed solution.

In the example illustrated in FIG. 1, there are two interface pads 3, each attached to the rim 82 of the steering wheel 8; of course, the interface pads 3 may also be connected to other structural portions of the steering wheel 8, such as for example the central portion, the pads then being located on either side and in proximity to the central portion (reference 3b in FIG. 1).

The light source 4 emits an optical beam mainly in the infrared band toward the steering wheel 8, and in particular toward the interface pads 3.

A plurality of separate light sources could be used. A plurality of imaging sensors 5 (cameras) could also be used. However, preferably, the system is able to use a single camera, and even the same camera already used for the drowsiness detection function.

Preferably, the light source 4 and the video camera (imaging sensor 5) are arranged in the vicinity of each other.

Alternatively, the light source 4 could be positioned not in the instrument panel 9 but in the vicinity of the latter; the same goes for the camera, which could be positioned not in the instrument panel 9 but in the vicinity of the latter, such as for example on the steering column of the steering wheel 8.

Figure 2:
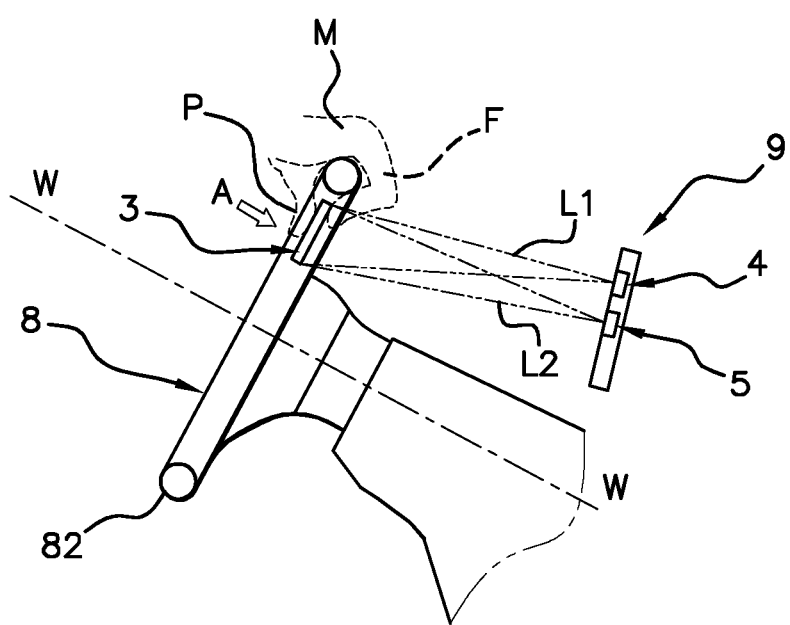

The light exiting from the light source 4 is emitted in the direction of the steering wheel 8 and of the driver (path denoted L1 in FIG. 2). Preferably, this light source 4 does not emit in the visible domain but mainly in the near-infrared domain.

Generally, the wavelength band [800 nm-1100 nm] is chosen, this band defining the near-infrared domain.

According to one particular option, the wavelength band [850 nm-940 nm] is chosen.

The light beam emitted by the light source 4 will preferably have a limited power, and in any case a power below the accepted thresholds of danger to the driver at the near-infrared wavelengths used.

Operation is ensured whatever the exterior ambient light conditions, i.e. not only under dark or dimpsy conditions, for example when driving at night, but also under daytime conditions and even under intense sunlight; the "hood-down convertible" version is also compatible and taken into consideration.

The video camera (imaging sensor 5) possesses a field of view that at least encompasses the possible positions of the interface pads 3 in the steering wheel 8. Here, it is the images captured by the video camera of the zone of the interface pads 3 that are of interest, and in particular the light rays emitted by the light source 4 and returned to the objective of the video camera via reflection from the interface pad 3 (path denoted L2 in FIG. 2).

Figure 3:
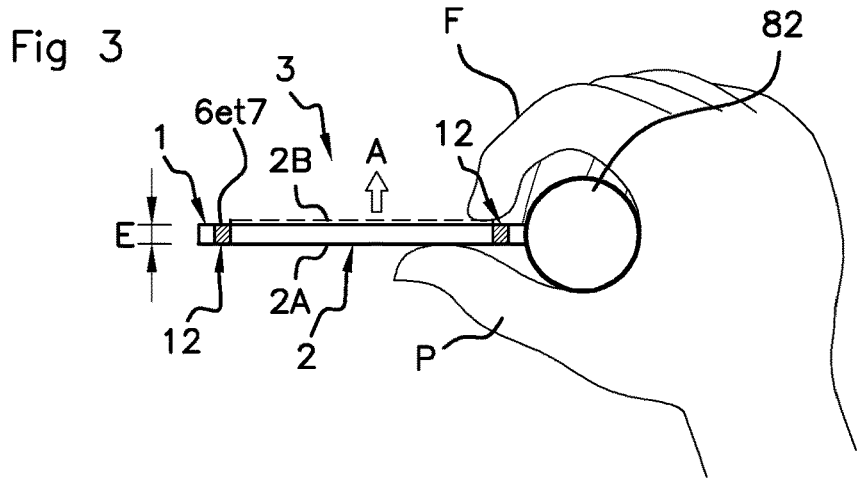
FIG. 3 shows a transverse cross-sectional view through the rim of the steering wheel with the interface pad, and a pushing action.
Figure 4:
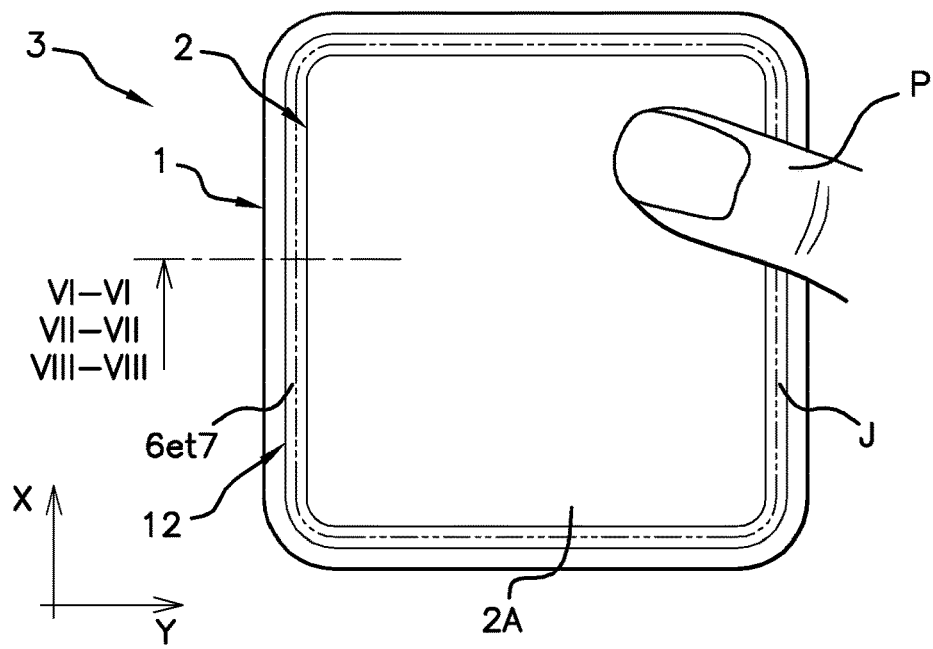
FIG. 4 shows, in more detail, a face-on view of the interface pad.
Figure 5:
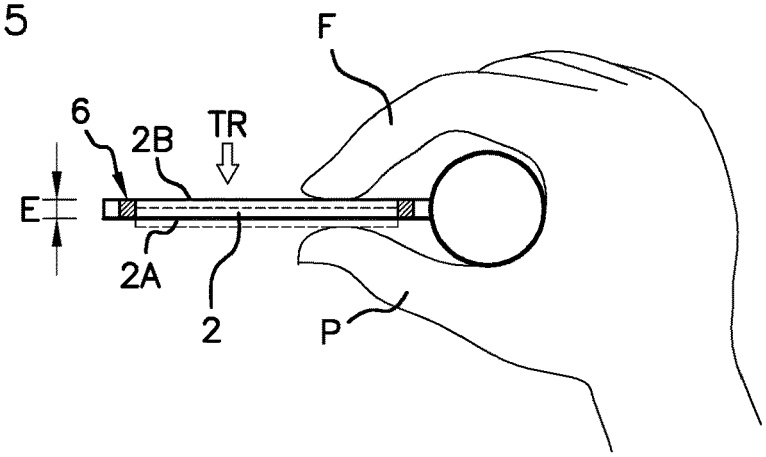
FIG. 5 is analogous to FIG. 3 and shows a transverse cross-sectional view through the rim of the steering wheel with the interface pad, and a pulling action.

The interface pad 3 comprises a base frame 1 that is securely fastened to the steering wheel 8 and a movable plate 2 (see FIGS. 3 and 4). The base frame 1 and the movable plate 2 lie generally together in a reference plane, denoted XY, and have a thickness E in the direction Z perpendicular to said plane XY.

A small thickness E, for example a thickness smaller than 8 mm, and even, preferably, smaller than 5 mm will be selected (design refinement and lightness). The interface pad 3A has a front face 2A that is visible to the driver and a back face 2B that is not visible to the driver.

The base frame 1 forms the peripheral zone of said interface pad 3 and encircles the movable plate 2, which lies generally in the central zone of the interface pad 3.

The movable plate 2 is movable between a rest position P0, which is adopted in the absence of exterior stress, and especially in the absence of a press of a finger, and at least one first activation position P1 that is obtained by pressing the finger P forward (arrow "A" in the figures).

This movement is made possible by virtue of the presence of a hinging zone 12 that forms the mechanical and incidentally optical interface between the movable plate 2 and the base frame 1.

According to one optional feature, provision is also made for the opposite activation direction and in particular a second activation position P2 obtained by pressing the finger F toward the driver (arrow "TR" in the figures), i.e. in practice a traction applied by the index finger, the middle finger, the ring finger or the little finger (or a plurality of these fingers).

As in the example illustrated in FIG. 4, the hinging zone 12 may form a closed ring, i.e. completely encircle the movable plate 2. In the example illustrated in the figures, the movement used to displace the movable plate 2 is a quasi-translation along the axis Z.

According to other alternative solutions, the hinging zone could be different: a hinge could be located on one side and the inclined sides located opposite the hinge, the movement being a pivot about the hinge.

According to yet another solution, the mechanical coupling between the movable plate 2 and the base frame 1 may be achieved as will be described in detail below.

Figure 6A:
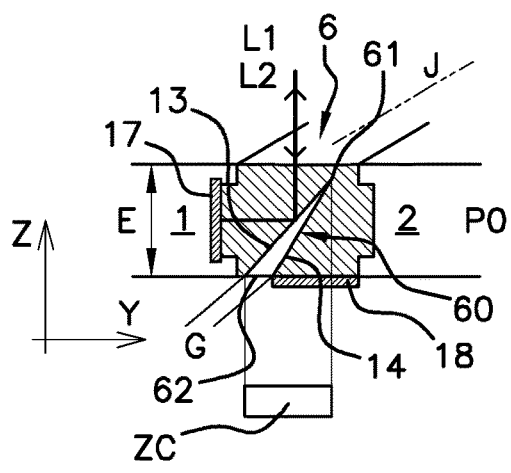
FIGS. 6A, 6B and 6C show a more detailed cross-sectional view of a first embodiment cut along the section line VI-VI illustrated in FIG. 4, FIGS. 7A, 7B and 7C show a cross-sectional view of a second embodiment cut along the section line VII-VII illustrated in FIG. 4, FIGS. 8A and 8B show a cross-sectional view of a third embodiment cut along the section line VIII-VIII illustrated in FIG. 4.
Figure 6B:
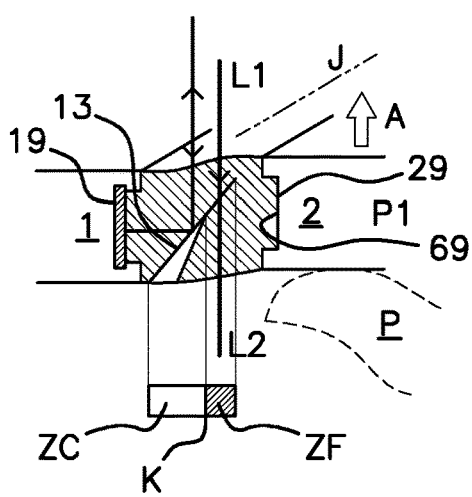
Figure 6C:
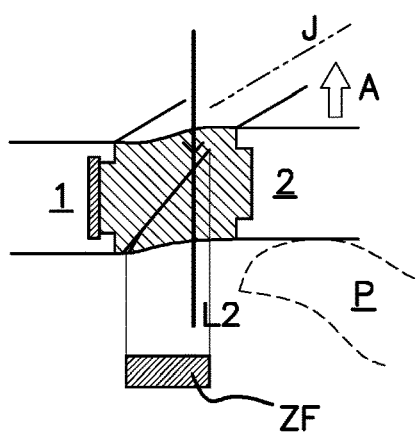

As may be seen in FIGS. 6A, 6B and 6C, according to a first embodiment, a deformable seal 6 is interposed, substantially in the reference plane XY, between the base frame 1 and the movable plate 2.

This deformable seal 6 is preferably made of supple silicone or of another elastomer having a good elasticity, i.e. a good resilience. This deformable seal 6 is preferably obtained by extrusion.

This deformable seal 6 is transparent to the infrared light rays of interest here, and has a refractive index substantially higher than that of air, and typically comprised between 1.3 and 1.6. According to one particular case, it is possible to choose an index such that the critical angle at which total reflection occurs is lower than or equal to 45°, i.e. an index higher than 1.41.

This deformable seal 6 extends, along its longitudinal axis J, along the interface between the base frame 1 and the movable plate 2, all the way therearound in one particular case or indeed such is to present a discontinuity on one side for example.

This deformable seal 6 comprises a notch 60 that extends along its longitudinal axis J. In its shape at rest, this notch forms a wedge-shaped empty space (i.e. a wedge-shaped interval) that extends from the bottom 61 to a mouth 62.

One of the sides (one of the flanks) of this notch forms a first inclined facet 13, and the other side of this notch forms a second inclined facet 14.

The reference with respect to which the notion of inclination is defined is here the reference plane XY or the perpendicular direction Z. An inclination of 45°, which has the advantage of simplicity of the shapes and optical path employed, is preferably chosen.

The first inclined facet 13 and the second inclined facet 14 have substantially planar surfaces. These surfaces may interact with each other when they are pressed against each other.

The interval G of the mouth 62 at rest has a typical dimension of 1 mm, and generally a typical dimension comprised between 0.5 mm and 2 mm.

The deformable seal 6, has, on the side on which it engages with the base frame 1, a tenon shape 69 and the base frame 1 has a mortise shape 19 that interacts, via conformal contact, with the aforementioned tenon shape 69.

Similarly, on the side of the movable plate 2, provision is made for a mortise shape 29 intended to receive a tenon shape 69 belonging to the deformable seal 6. Other fastening means, such as the use of a structural adhesive for example, are not excluded.

Any other equivalent mounting solution achieved via conformal contact may alternatively be used.

In one configuration, provision may be made for the reflective strip 17 to naturally lodge at the bottom of the groove of the mortise 19.

Said first and second inclined facets 13 and 14 together form an optical zone of interest Z12 seen by the camera (FIG. 9).

In the example illustrated in FIG. 6A, in which no action is being exerted on the movable plate 2 (configuration P0 in the absence of exterior stress) the deformable seal 6 is at rest, the wedge-shaped notch is open over all its width and over all its axial length J, and the optical path L1, L2 that starts at the light source 4 is the following: diffraction on the first inclined facet 13, then reflection from a reflective strip 17 and, in this location, return at 180°, then diffraction from the first inclined facet 13 again and return in the direction of the camera.

The reflective strip 17 has a reflective effect, at least on the near-infrared light rays located precisely on the refracted optical path.

By virtue of the reflective strip 17, the overall degree of optical return is therefore high, and the inclined facet 13 is clearly visible in the images captured by the camera (reference Z12 FIG. 9).

The bright zone perceived by the camera occupies all the width of the notch—it is schematically represented by the light zone denoted ZC in FIG. 6A.

In a first configuration (FIG. 6B), in the activation position P1 obtained by the press of the finger P, the width of the notch 60 decreases: starting from the bottom of the notch, the second inclined facet 14 makes contact with the first inclined facet 13 over a certain depth.

Therefore, the bright zone denoted ZC decreases in width whereas, in the zone in which the two inclined facets make contact, a dim (again from the point of view of the camera) zone denoted ZF instead forms. The bright zone ZC and the dim zone ZF are separated by a limit denoted K.

When the press on the movable plate 2 is more pronounced, as illustrated in FIG. 6C, the entirety of the notch 60 may find itself closed, and then the bright zone ZC is greatly diminished, or even completely eliminated, whilst the width of the dim zone ZF is increased.

Therefore, it will be understood that the limit K between the bright zone ZC and the dim zone ZF moves proportionally to the strength of the force applied to the movable plate 2. With respect to materials, polycarbonate or PMMA will preferably be chosen for the base frame 1 and for the movable plate 2. Preferably, a material that is transparent in the infrared will be chosen for the movable plate 2.

As mentioned above, in the absence of external mechanical stresses, the movable plate 2 is returned to the rest position P0 by returning means. In the illustrated example, it is the resilience of the seal 6 that creates the force of return to the rest position P0. It will be noted that a solution based on a return means of spring type is not excluded.

Figure 7A:
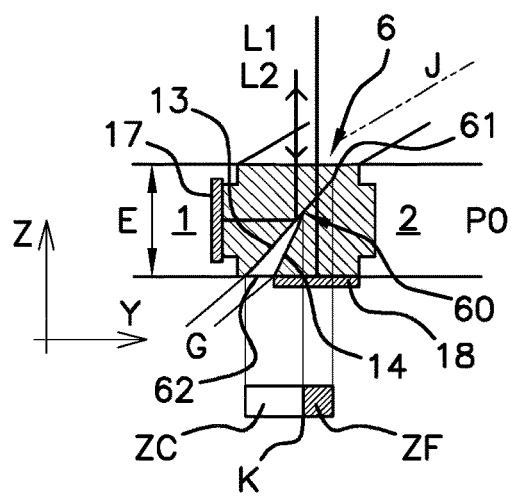
Figure 7B:
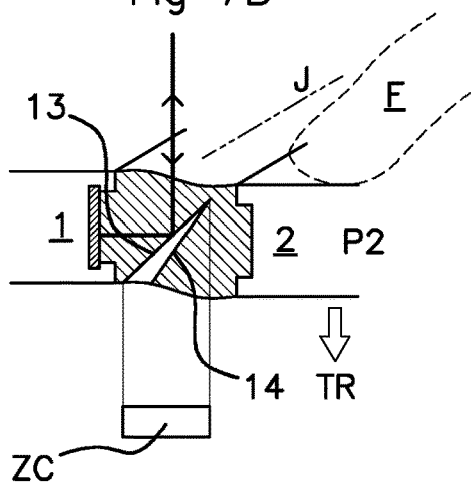
Figure 7C:
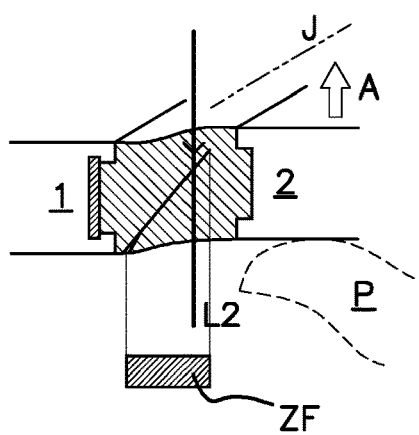

FIGS. 7A, 7B and 7C illustrate a variant of the configuration depicted in FIGS. 6A, 6B and 6C; in this variant, the user may push the movable plate and he may also pull on the movable plate—both directions are possible.

Most of the elements will not be described again because only the arrangement and operation of the hinge 60 are different.

FIG. 7A shows the configuration in the rest position P0, namely without external stress. In the may be seen that the notch 60 is half closed, as precedingly in FIG. 6B (from the point of view of the camera, there is a bright zone ZC and a dim zone ZF) and the limit K between the bright zone ZC and the dim zone ZF is therefore in the vicinity of the middle of the width of the wedge-shaped notch 60.

When the movable plate 2 is pulled on (position P2, as illustrated in FIG. 7B) the notch 60 is fully opened and hence the bright zone ZC is greatly widened whereas the dim zone ZF decreases in width or even disappears completely. The limit K moves to the right proportionally to the force of the traction.

When the movable plate 2 is pressed on, as illustrated in FIG. 7C, the notch 60 is fully closed and then the bright zone ZC is greatly diminished, or even completely eliminated, whereas the width of the dim zone ZF is increased. The limit K moves to the left proportionally to the force of the press.

The deformation, which is continuous and proportional, depends on the applied force, and therefore the respective sizes of the bright and dim zones ZC, ZF and the position of the limit K vary proportionally depending on the applied force, these elements being decoded by the analysis of the images captured by the camera 5.

Advantageously, an almost symmetric response to the action of pushing and the action of pulling is therefore obtained.

According to another embodiment, shown in FIGS. 8A and 8B, an extruded elastic deformable seal, referenced 7, is interposed along the transverse direction Z between a border 91 belonging to the base frame 1 and a border 92 belonging to the movable plate: in other words the deformable seal 7 is sandwiched between the two borders 91 and 92.

In the illustrated example, the deformable seal 7 has a double trapezoidal cross section with a first inclined facet 15 and a second inclined facet 16 that is inclined away from the first. The deformable seal 7 comprises a long base (at the top in FIGS. 8A and 8B) and a short base (at the bottom in FIGS. 8A and 8B), said bases being parallel to each other.

The segment of the optical beam (L1, L2) that returns to the camera comprises a diffraction on the first inclined facet 15, and a diffraction on the second inclined facet 16. The optical beam (L1, L2) therefore undergoes two changes of direction of 90 degrees.

In contrast, the incident light beam passes through the bases of the trapezoid in a straight line, this creating in this location a zone ZF that appears dim to the camera (no return to the camera). An optically absorbent strip 18 may be provided on the movable plate 2.

Optionally, a cavity 75 forming a hollow core may be provided in the interior of the seal 7. This hollow shape promotes squashing of the seal and a widening of the base of the trapezoid.

FIG. 8A illustrates the rest position P0 in the absence of external stress. Seen from the camera, by virtue of the various inclined facets (two pairs in the example) an alternation of bright zones ZC and dim zones ZF, and of limits K between the bright zones ZC and the dim zones ZF is obtained.

FIG. 8B illustrates an activation position P1; with application of an external stress, the seal 7 is squashed by the applied force and its long base gets longer, in the Y direction in the illustrated example. The size of the central dim zone ZF has decreased (reference ZF2), whereas, in contrast, the size of the bright zones that border the central dim zone has increased (reference ZC2).

In the configurations illustrated in FIGS. 6A-6C and 7A-7C, with such elastically deformable seals 6, 7, which naturally generate a return force, it is possible to obtain a profile of very small thickness for the interface pad; the thickness E may be smaller than 4 mm, or even smaller than 3 mm.

Provision may be made for a push-button effect, which may be intrinsic to the seal or achieved via a separate external means.

FIG. 9 illustrates the zone of contrasts of interest, denoted Z12, that corresponds to all the positions of the points of the inclined edges seen by the camera.

Figure 12:
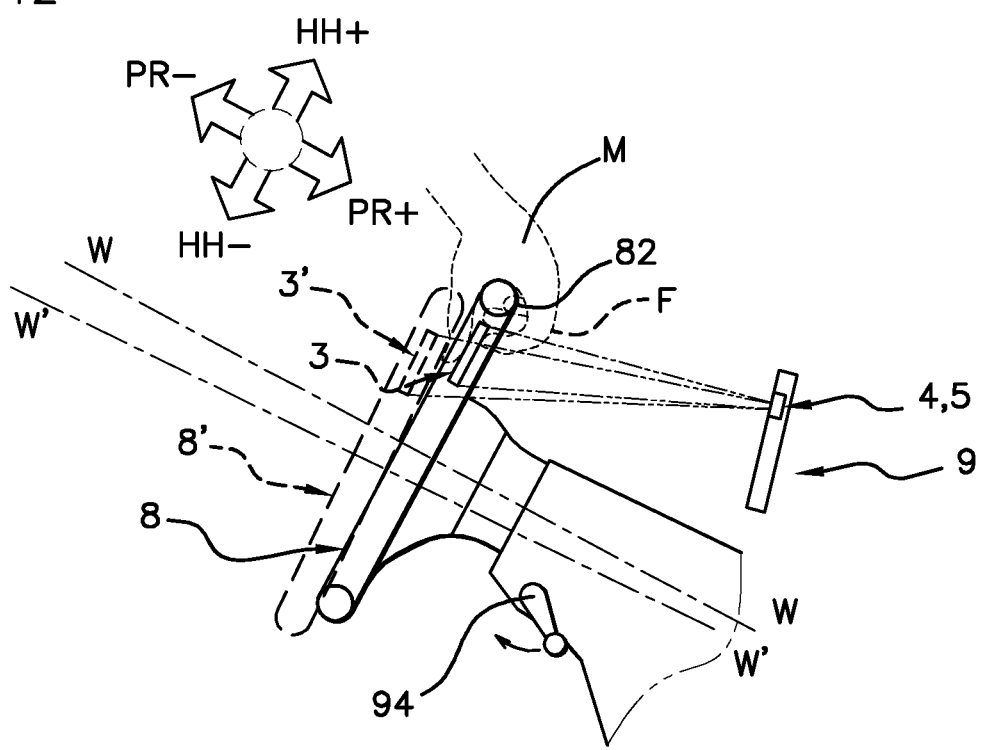
FIG. 12 illustrates the adjustment of the position of the steering wheel.

In conjunction with FIG. 12, it will be understood that the zone of contrasts of interest Z12 may moreover adopt a different position Z12' if the steering wheel is not completely straight, for example if the driver is on a motorway with a slight curve, the steering wheel then having a steering wheel angle θ that is not equal to zero even though road-safety conditions permit the driver to interact with an on-board system by virtue of the interface pad 3.

FIG. 10 illustrates various finger movements typical of a touchscreen human-machine interface: scroll to the right 71, scroll to the left 72, scroll upward 73, scroll downward 74 and click 70; the click 70 has the particularity that it is the contrast effect observed in the optical zone of interest Z12 that reveals the press and not simply the approach of a finger (analysis of the blurriness or clearness of the image of the finger). Images captured through the movable plate 2 are analyzed to detect one of the aforementioned movements 71, 72, 73, 74.

Figure 11:
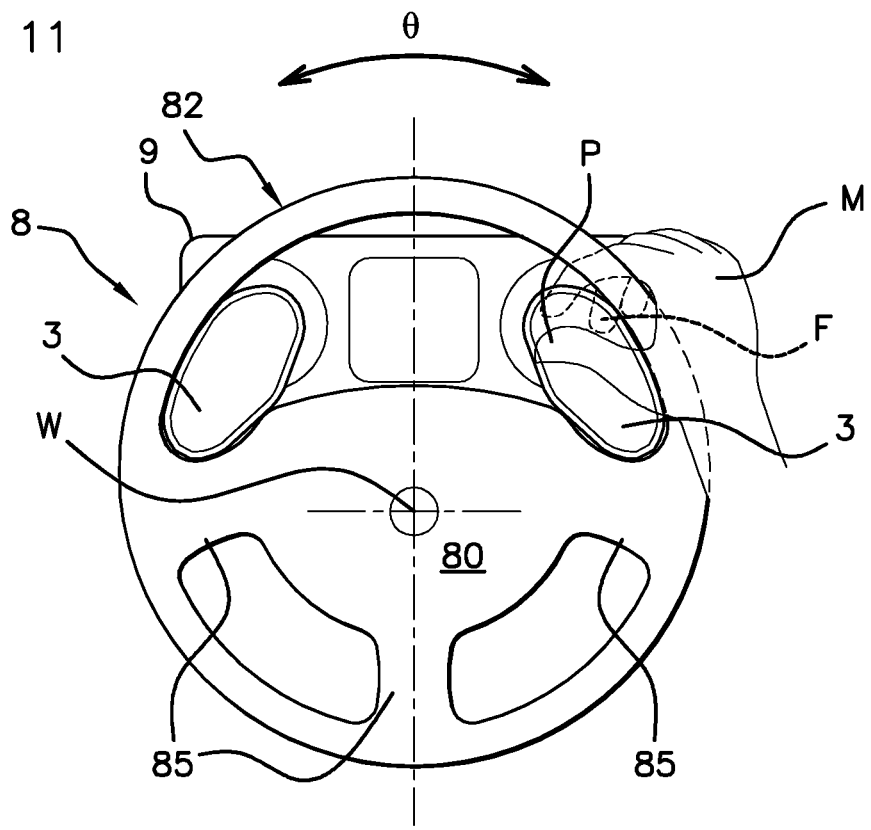
FIG. 11 shows another type of steering wheel and of interface pad.

FIG. 11 is analogous to FIG. 1 and its essential elements are similar and will not be described in detail again. FIG. 11 illustrates different shapes and positions of the interface pads 3.

Typical dimensions for the interface pad: 5×5 cm, but any other dimensions compatible with a placement between the rim of the steering wheel and the hub of the steering wheel may be chosen.

Width of the border forming the optical zone of contrasts of interest: 3 to 6 mm.

It will be noted that it is possible to provide a cover plate on the front face 2A, said cover plate being intended to cover the optical and mechanical interface elements between the base frame and the movable plate.

It will be noted that the light source 4 may optionally be pulsed and the images analyzed synchronously with the activation of the light source 4.

Moreover, a conventional system for adjusting the position of the steering wheel 8 comprises an unlocking handle 94 that, when it is activated, permits a depthwise movement in the directions PR+ and PR− and a heightwise movement in the directions HH+ and HH− (see FIG. 12). In the example, one position of the steering wheel 8, W has been shown with solid lines, and another position with dashed lines 8', W'. The interface pad 3 follows the movement and moves to the position 3'. The position of the zone of contrasts may vary, even depthwise, but this does not prevent the contrast effect from manifesting itself as soon as the driver presses on the movable plate 2.

It will be noted that the interface pad 3 contains no electronic components, solely elements participating in an optical function.

Moreover, the movable plate 2 and the base frame 1 could be transparent in the visible domain in order to limit the restriction of the driver's sight through the steering wheel 8.

According to one advantageous aspect, a force's strength is detected. The analysis of the images may use a decision threshold to determine whether the press is sufficient or not to constitute a "click". Furthermore, two decision thresholds may be used to determine whether it is a question of a soft press or of a pronounced press.

According to one advantageous aspect, an asymmetry in the press on the movable plate may be detected; for example, one side may be pressed down further than the opposite side and this difference is reflected in the width of the light zone and the analysis of the images perceived by the camera allows the side pressed down furthest to be detected.

The invention claimed is:

1. A system for detecting command gestures made by at least one finger (P, F) of a driver of a motor vehicle, the system comprising:
    at least one interface pad (3) located in proximity to the rim of the steering wheel (8),
    at least one light source (4) that emits an optical beam (L1) mainly in the infrared band toward the interface pad,
    an imaging sensor (5), for capturing at least images steered (L2) by the interface pad away from the driver, wherein the interface pad (3) comprises a base frame (1) and a movable plate (2) that is movable between a rest position (PO) and one or more activation positions (P1, P2) obtained by pressing one of the fingers (P, F) on the movable plate (2), the base frame (1) and the movable plate (2) lying generally in a reference plane XY and having a small thickness in the direction Z perpendicular to said reference plane XY, an optical zone of interest seen by the imaging sensor being defined at the interface between the base frame (1) and the movable plate (2), wherein charactcrizcd in that the interface pad (3) comprises an elastic deformable seal (6; 7) interposed between the base frame (1) and the movable plate (2), the elastic deformable seal (6; 7) comprising at least one inclined facet (13; 15), so that an optical path (L1, L2) passing via the first inclined facet (13) is proportionally modified by the deformation of the elastic deformable seal (6; 7) under the effect of the movement of the movable plate (2) and the modification of the optical path (L1, L2) is detectable by the imaging sensor (5), cspccially in its gc mctry, in the optical zone of interest seen by the imaging sensor (5).

2. The system as claimed in claim 1, wherein the first inclined facet (13) is located facing a second inclined facet (14), which is separated from the first inclined facet (13) by a wedge-shaped interval (60) the geometry of which is gradually modified depending on a force exerted on the movable plate (2).

3. The system as claimed in claim 2, wherein the wedge-shaped interval (60) closes when a finger (P) presses on the movable plate (2) in the direction of the imaging sensor (5).

4. The system as claimed in claim 3, wherein the wedge-shaped interval (60) opens when a finger (F) presses on the movable plate (2) in the direction of the driver.

5. The system as claimed in claim 3, wherein the segment of the optical beam (L1, L2) that returns to the imaging sensor (5) comprises a diffraction from the first inclined facet (13), a reflection from a reflective strip (17) and a new diffraction on the first inclined facet (13), then a return to the imaging sensor (5).

6. The system as claimed in claim 4, wherein the segment of the optical beam (L1) that does not return to the imaging sensor (5) passes through the first and second inclined facets (13, 14) substantially in a straight line.

7. The system as claimed in claim 1, wherein the elastic deformable seal (7) has a trapezoidal general cross section with a first inclined facet (15) and a second inclined facet (16) that is inclined opposite the first, the segment of the optical beam (L1, L2) that returns to the imaging sensor (5) comprising a diffraction from the first inclined facet (15) and a diffraction on the second inclined facet (16).

8. The system as claimed in claim 1, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

9. The system as claimed in claim 1, wherein the movable plate (2) is transparent at least to infrared light, so as to be able to detect movements of a finger inside the zone covered by the movable plate (2) through the movable plate (2).

10. The system as claimed in claim 1, wherein the light source (4) emits in the near-infrared band, typically in the wavelength band 850 nm-940 nm, and does not emit in the visible band.

11. The system as claimed in claim 1, wherein provision is made for an elastic return of the movable plate (2) to the rest position.

12. The system of claim 1, wherein the modification of the optical path (L1, L2) is detectable by the imaging sensor (5), in its geometry, in the optical zone of interest seen by the imaging sensor (5).

13. The system as claimed in claim 2, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

14. The system as claimed in claim 3, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

15. The system as claimed in claim 4, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

16. The system as claimed in claim 5, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

17. The system as claimed in claim 6, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

18. The system as claimed in claim 7, wherein bright zones (ZC) and dim zones (ZF) are created as seen by the imaging sensor (5), the bright zones (ZC) and the dim zones (ZF) being separated by a limit (K), and this limit is moved proportionally to the force exerted on the movable plate (2).

19. The system as claimed in claim 2, wherein the movable plate (2) is transparent at least to infrared light, so as to be able to detect movements of a finger inside the zone covered by the movable plate (2) through the movable plate (2).

20. The system as claimed in claim 1, wherein provision is made for an elastic return of the movable plate (2) to the rest position, said return being achieved via the intrinsic resilience of the elastic deformable seal (6; 7).

* * * * *